United States Patent
Ono

(10) Patent No.: US 6,739,261 B2
(45) Date of Patent: May 25, 2004

(54) DEVICE FOR SELECTING AND CONVEYING PRINTING PLATES

(75) Inventor: Tsukasa Ono, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/184,965

(22) Filed: Jul. 1, 2002

(65) Prior Publication Data

US 2003/0005839 A1 Jan. 9, 2003

(30) Foreign Application Priority Data

Jul. 3, 2001 (JP) ........................ 2001-202370

(51) Int. Cl.[7] .............. B65H 3/44; B41L 47/14
(52) U.S. Cl. ............. 101/477; 271/105; 271/9.08; 271/11
(58) Field of Search ............. 101/477, 479, 101/480; 271/9.05, 9.08, 9.11, 105, 107, 186, 11, 104, 106, 161, 162, 164, 170; 414/796.4, 797, 788, 773, 783, 416.03, 416.08

(56) References Cited

U.S. PATENT DOCUMENTS 4,759,679 A * 7/1988 Muller .............. 414/416.01
5,201,506 A * 4/1993 Kushima et al. ............ 271/5

FOREIGN PATENT DOCUMENTS

| EP | 1 055 621 A2 | * 11/2000 |
| EP | 1 061 019 | * 12/2000 |
| JP | 60-232338 | * 11/1985 |
| JP | 60-232339 | * 11/1985 |
| JP | 03-297741 | * 12/1991 |

* cited by examiner

Primary Examiner—Leslie J. Evanisko
(74) Attorney, Agent, or Firm—Sughrue Mion, PLLC

(57) ABSTRACT

A device for selecting and conveying printing plates is provided which can overcome complexity of work involved in so-called batch processing, and can realize operation of, for example, removing a printing plate from a cassette in a small space, such that operation efficiency can be improved and less space is required. Cassettes other than a lowest cassette are independently supported on sliding bases. The sliding bases move (slide) on rails with hardly any frictional resistance. The rails extend to a cassette withdrawing space section provided adjacent, and unnecessary cassettes are moved horizontally along the rails. Thus, a printing plate can be removed from a needed cassette at a reference position without the needed cassette being moved at all. In this way, there is no need to provide, at each cassette, space for removing the printing plate, and no need to move a printing plate removing device to positions at which the cassettes are disposed.

11 Claims, 15 Drawing Sheets

FIG.4A
FIG.4B
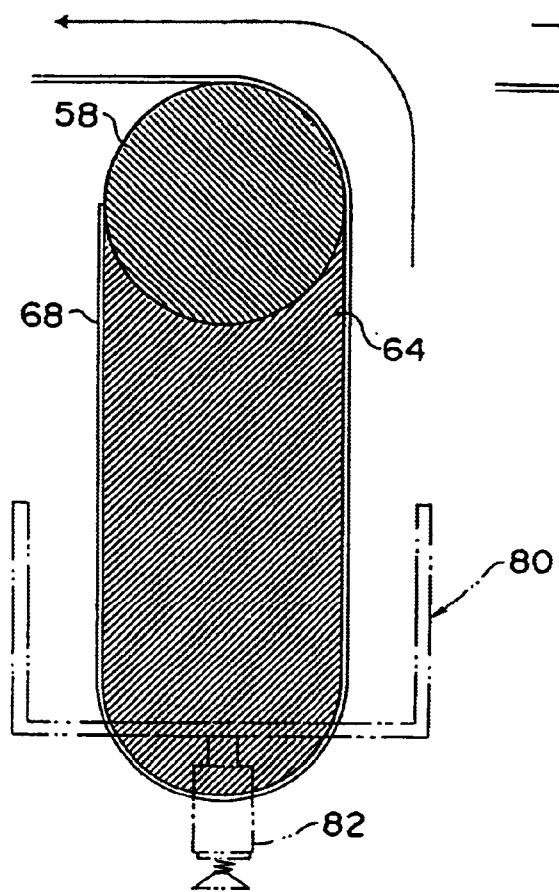
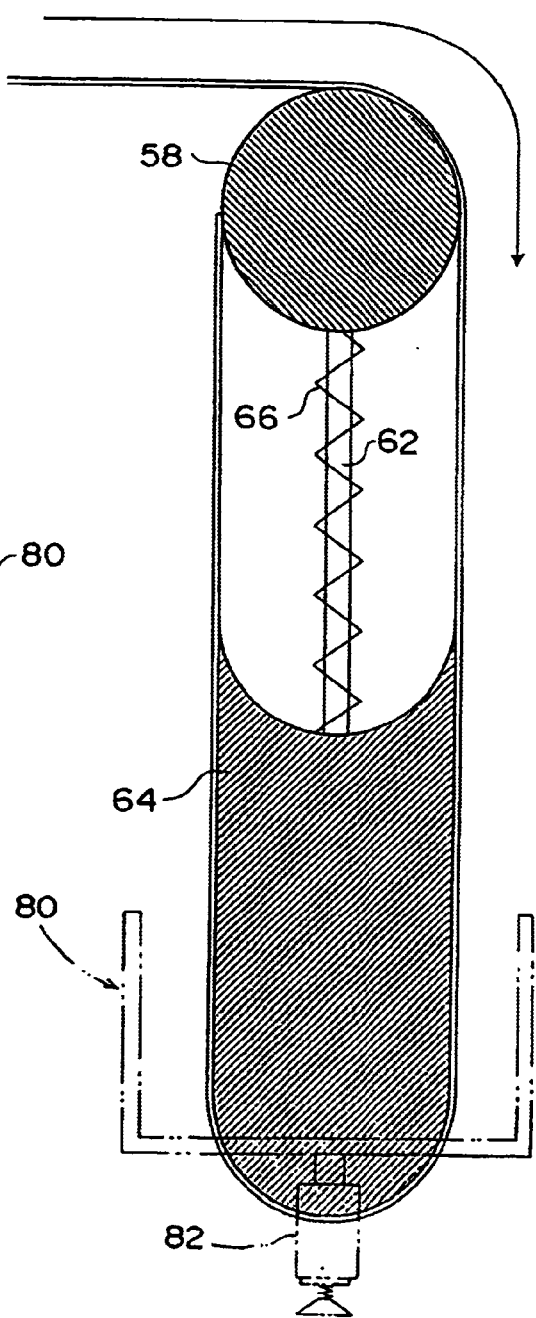

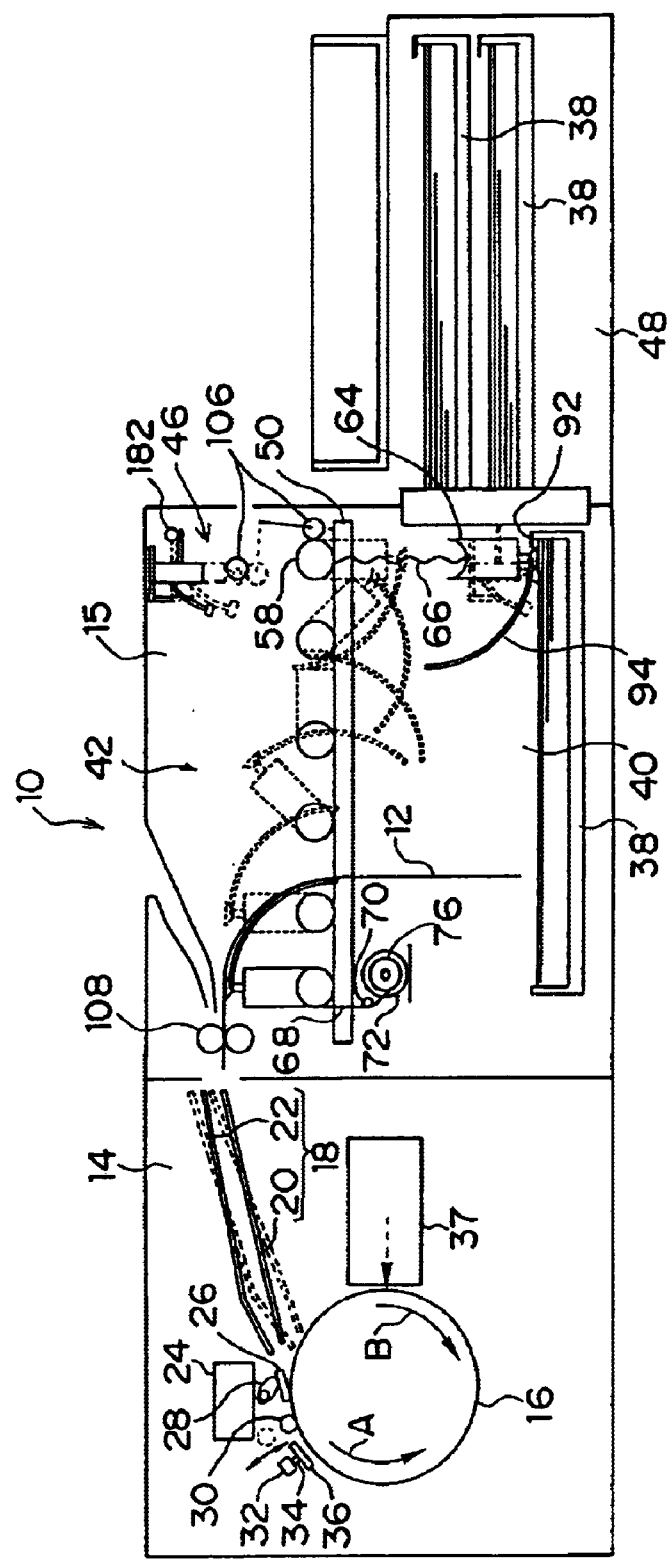

DEVICE FOR SELECTING AND CONVEYING PRINTING PLATES

BACKGROUND OF THE INVENTION

1. Field of the Invention

The present invention relates to a device for selecting and conveying printing plates which accommodates plural types of printing plates in cassettes exclusively used for the respective types of printing plates, and arbitrarily selects a printing plate from the plural cassettes, and conveys the printing plate to a subsequent process.

2. Description of the Related Art

Techniques (printing plate exposure devices) have been developed which, by utilizing a printing plate in which a photosensitive layer is provided on a support, record an image directly onto the photosensitive layer (emulsion surface) of the printing plate by a laser beam or the like. With such a technique, it is possible to quickly record an image onto a printing plate.

Cassettes, which accommodate plural printing plates which are stacked one on another, are loaded in an automatic printing plate exposure device which uses the technique of recording images onto printing plates. The printing plates are removed one-by-one from the cassettes, and are fed into an exposure section.

The cassette is loaded substantially parallel to the surface on which the device is set. A plurality of printing plates are stacked on a stacking base of the cassette.

In this state, in order to remove the uppermost printing plate, usually, the printing plate is suctioned by suction cups. The suction cups which are suctioning the printing plate are guided along guide rails or the like and fed into the exposure section which is the subsequent process.

There are plural types of printing plates having different sizes, materials, and the like. Usually, each cassette accommodates a single, different type of printing plate, and plural cassettes are usually stored in a separate place from the device. A needed cassette is loaded into the device, and the aforementioned operation of removing the printing plate from the cassette is carried out.

However, there are cases in which a single device requires plural types of printing plates randomly, and processes these plural types of printing plates. In such cases, the work of replacing a cassette must be carried out each time a different type of printing plate is to be exposed. The work is complex and work efficiency markedly deteriorates.

Thus, conventionally, a plurality of cassettes are disposed in advance within the device. When a printing plate of a specific type is needed, the corresponding cassette is moved to a predetermined position, and a printing plate is removed from that cassette which has been moved to the predetermined position.

In this case, a so-called batch system is used in which, when the removal of a printing plate from one cassette has been completed, that cassette must be returned to its original position. Thus, this system is not advantageous from the standpoint of efficiency.

In order to overcome this drawback, a method has been proposed in which a plate removing device is moved to the respective cassettes, without the cassettes being moved within the device. In this way, the cassettes do not move, and work efficiency can be improved.

However, the plate removing device must be moved each time to a position corresponding to a position of a different cassette. Further, space must be provided for the plate removal operation at the respective positions corresponding to the plural cassettes. Thus, even more space is required for placement of the entire device.

SUMMARY OF THE INVENTION

In view of the aforementioned, an object of the present invention is to provide a device for selecting and conveying printing plates which eliminates the complexities involved in the work of so-called batch processing, and which, by realizing, in a small space, the operation of removing printing plates from cassettes, can save on space and improve work efficiency.

In order to achieve the above object, in accordance with a first aspect of the present invention, there is provided a device for selecting and conveying printing plates, comprising: a plurality of cassettes each able to accommodate a plurality of printing plates in a state in which the printing plates are stacked substantially horizontally, the plurality of cassettes being respectively movable, independently from others of the plurality of cassettes, between removal positions and withdrawn positions which are set apart from the removal positions substantially in a horizontal direction; and a conveying unit able to access each cassette of the plurality of cassettes in order to remove a printing plate from a cassette positioned at the removal position, wherein all of the cassettes are aligned in a row vertically beneath the conveying unit when the cassettes are positioned at the removal positions.

BRIEF DESCRIPTION OF THE DRAWINGS

FIGS. 4A and 4B are front views showing a state in which a bracket and a rotating/moving body, which is a raising/lowering mechanism section of a suction cup unit, are connected.

FIG. 11 is a front view, corresponding to FIG. 1, of the automatic printing plate exposure device at a time of removing a printing plate from the lowest (the third) cassette.

DESCRIPTION OF THE PREFERRED EMBODIMENTS

Figure 1:
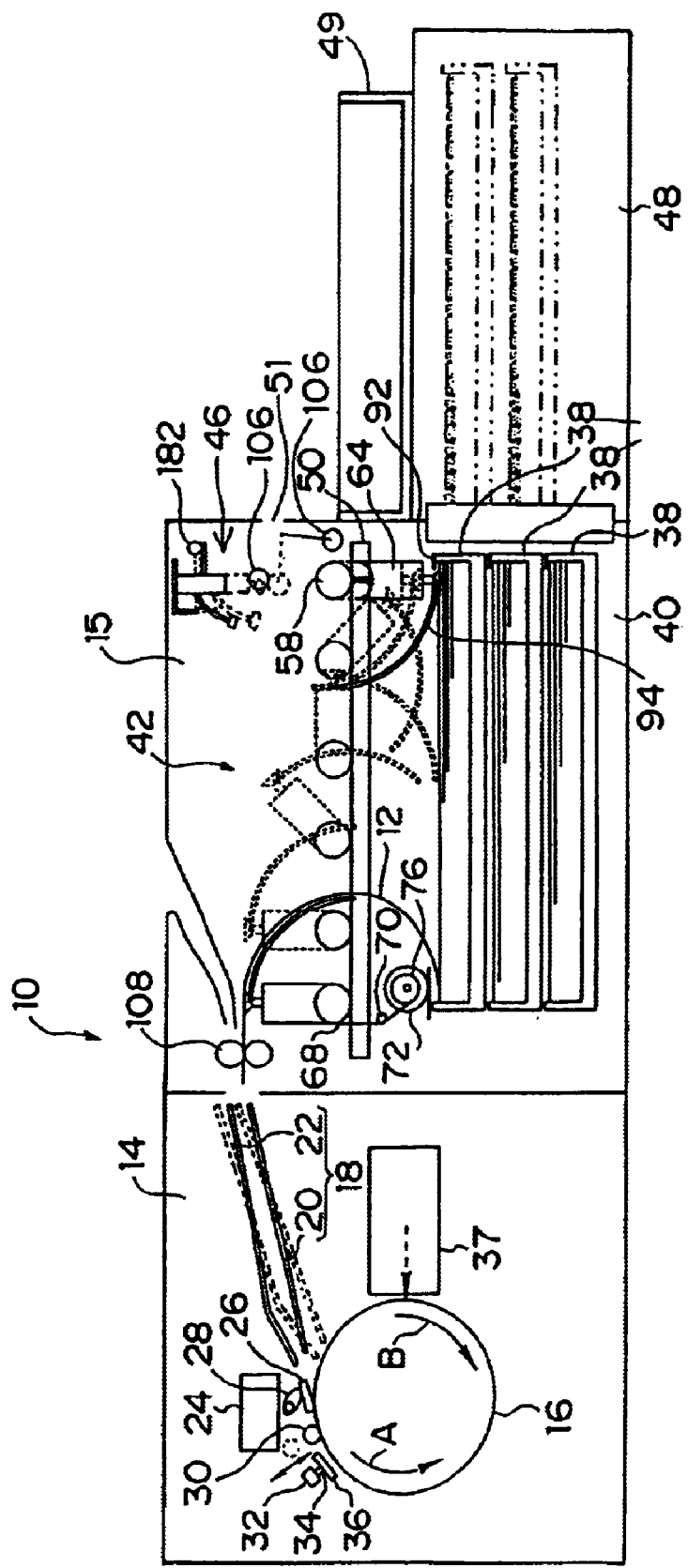
FIG. 1 is a schematic diagram of an automatic printing plate exposure device relating to the present embodiment.

An automatic printing plate exposure device 10 relating to the present embodiment is illustrated in FIG. 1.

The automatic printing plate exposure device 10 is divided into two sections ("blocks") which are an exposure section 14 and a plate removing/conveying section 15. The exposure section 14 irradiates a light beam onto an image forming layer of a printing plate 12 so as to expose an image thereon. The plate removing/conveying section 15 removes the printing plate 12 and conveys it to the exposure section 14. The printing plate 12 which has been subjected to exposure processing is fed-out, by the automatic printing plate exposure device 10, to a developing device (not illustrated) which is set adjacent to the automatic printing plate exposure device 10.

A rotating drum 16, around whose peripheral surface the printing plate 12 is wound and held, forms the main portion of the exposure section 14. The printing plate 12 is guided by a conveying guide unit 18 and fed-in in a direction tangent to the rotating drum 16. The conveying guide unit 18 is formed by a plate supplying guide 20 and a plate discharging guide 22. Conveying rollers 108 and a guide plate are disposed at the side of the conveying guide unit 18 bordering on the plate removing/conveying section 15.

The plate supplying guide 20 and the plate discharging guide 22 of the conveying guide unit 18 are positioned so as to form a sideways V-shape, and rotate over a predetermined angle around the right end portions thereof in FIG. 1. Due to this rotation, the plate supplying guide 20 or the plate discharging guide 22 can selectively be made to correspond to the rotating drum 16 (can be disposed in a direction tangent to the rotating drum 16).

A puncher 24 is disposed in a vicinity of the conveying guide unit 18. By making the plate supplying guide 20 oppose the puncher 24, the leading end of the printing plate 12 can be fed into the puncher 24.

The printing plate 12 which has been fed in from the plate removing/conveying section 15 is first guided by the plate supplying guide 20 and fed into the puncher 24 where a notch for positioning is formed in the leading end of the printing plate 12.

After being subjected to processing by the puncher 24, the printing plate 12 is temporarily returned to the plate supplying guide 20, and is thereby moved to a position corresponding to the rotating drum 16.

The rotating drum 16 is rotated, by an unillustrated driving means, in a direction of attaching and exposing the printing plate 12 (the direction of arrow A in FIG. 1), and a direction of removing the printing plate 12 (the direction of arrow B in FIG. 1) which is opposite to the attaching/exposing direction.

As shown in FIG. 1, a leading end chuck 26 is mounted at a predetermined position of the outer peripheral surface of the rotating drum 16 provided in the exposure section 14. In the exposure section 14, when the printing plate 12 is to be attached to the rotating drum 16, first, the rotating drum 16 is stopped at a position (printing plate attaching position) where the leading end chuck 26 opposes the leading end of the printing plate 12 which has been fed-in by the plate supplying guide 20 of the conveying guide unit 18.

At the exposure section 14, an attaching cam 28 is provided so as to oppose the leading end chuck 26 at the printing plate attaching position. Due to the attaching cam 28 rotating and pushing one end side of the leading end chuck 26, the printing plate 12 can be inserted between the leading end chuck 26 and the peripheral surface of the rotating drum 16.

At the exposure section 14, in the state in which the leading end of the printing plate 12 is inserted between the leading end chuck 26 and the rotating drum 16, the attaching cam 28 is returned to its previous position, and the pressing of the leading end chuck 26 by the attaching cam 28 is released. In this way, the leading end of the printing plate 12 is nipped and held between the leading end chuck 26 and the peripheral surface of the rotating drum 16.

At this time, the printing plate 12 is positioned with respect to the rotating drum 16 by an unillustrated positioning pin, which projects from a predetermined position of the peripheral surface of the rotating drum 16, entering into the notch which was punched in the printing plate 12 by the puncher 24. Note that positioning may be carried out by the positioning pin abutting the leading end of the printing plate 12.

At the exposure section 14, when the leading end of the printing plate 12 is fixed to the rotating drum 16, the rotating drum 16 is rotated in the attaching/exposing direction A. In this way, the printing plate 12, which has been fed-in from the plate supplying guide 20 of the conveying guide unit 18, is wound on the peripheral surface of the rotating drum 16.

A squeeze roller 30 is disposed in a vicinity of the peripheral surface of the rotating drum 16, at the attaching/exposing direction downstream side of the printing plate attaching position. Due to the squeeze roller 30 moving toward the rotating drum 16, the printing plate 12 wound on the rotating drum 16 is pressed toward the rotating drum 16 and is made to fit tightly to the peripheral surface of the rotating drum 16.

A trailing end chuck 32 attaching/removing unit 32 is disposed in a vicinity of the rotating drum 16 at the attaching/exposing direction downstream side of the squeeze roller 30 in the exposure section 14. At the trailing end chuck attaching/removing unit 32, a trailing end chuck 36 is mounted to the distal end of a shaft 34 which projects toward the rotating drum 16.

At the exposure section 14, when the trailing end of the printing plate 12 wound on the rotating drum 16 opposes the trailing end chuck attaching/removing unit 32, the shaft 34 is projected such that the trailing end chuck 36 is attached to a predetermined position of the rotating drum 16. In this way, the trailing end of the printing plate 12 is nipped and held between the trailing end chuck 36 and the rotating drum 16.

At the exposure section 14, when the leading end and the trailing end of the printing plate 12 are held at the rotating drum 16, the squeeze roller 30 is moved away. Thereafter, at the exposure section 14, while the rotating drum 16 is rotated at high speed at a predetermined rotational speed, a light beam, which is modulated on the basis of image data, is irradiated from a recording head section 37 synchronously with the rotation of the rotating drum 16. In this way, the printing plate 12 is scan-exposed on the basis of the image data.

When scan-exposure of the printing plate 12 is completed, at the exposure section 14, the rotating drum 16 is temporarily stopped at a position at which the trailing end chuck 36, which is holding the trailing end of the printing plate 12, opposes the trailing end chuck attaching/removing unit 32, and the trailing end chuck 36 is removed from the rotating drum 16. In this way, the trailing end of the printing plate 12 is released.

Thereafter, by rotating the rotating drum 16 in the direction of removing the printing plate 12 (i.e., in direction B), the printing plate 12 is discharged, from the trailing end side thereof, to the plate discharging guide 22 of the conveying guide unit 18 along a direction tangent to the rotating drum 16. Thereafter, the printing plate 12 is conveyed to the developing device which is the subsequent process.

Figure 2:
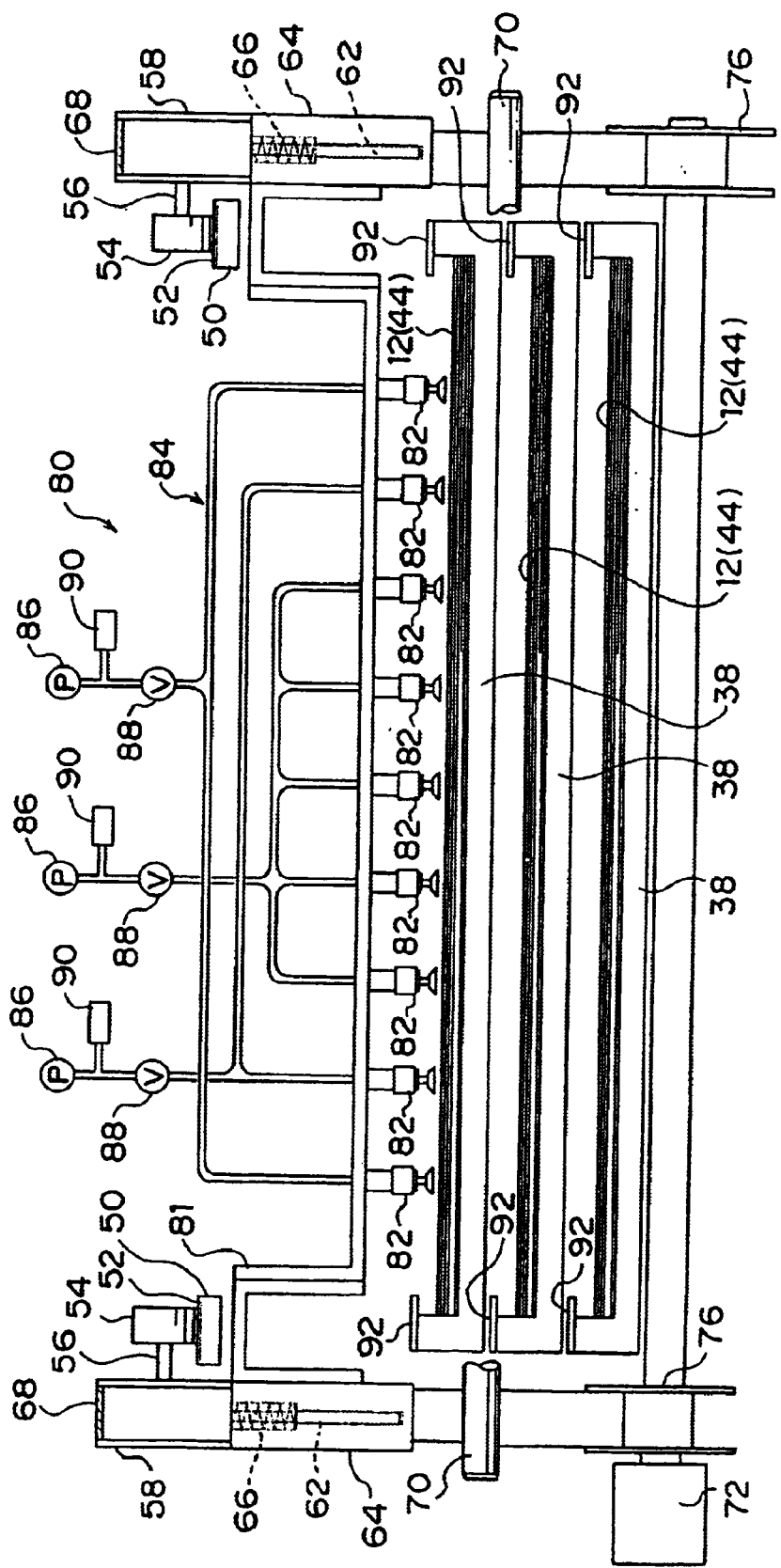
FIG. 2 is a right side view of FIG. 1.

As shown in FIGS. 1 and 2, a cassette accommodating section 40 is provided in the plate removing/conveying section 15. A plurality of cassettes 38, which are disposed parallel to the surface on which the automatic printing plate exposure device 10 is set, are accommodated in the cassette accommodating section 40 in a state of being superposed one above the other. Although there are three cassettes 38 in the present embodiment, the number of cassettes is not limited to the same.

A conveying unit 42, which is for removing the printing plates 12 from the cassettes 38 and conveying the printing plates 12 to the exposure section 14, is provided above the cassette accommodating section 40.

Figure 3:
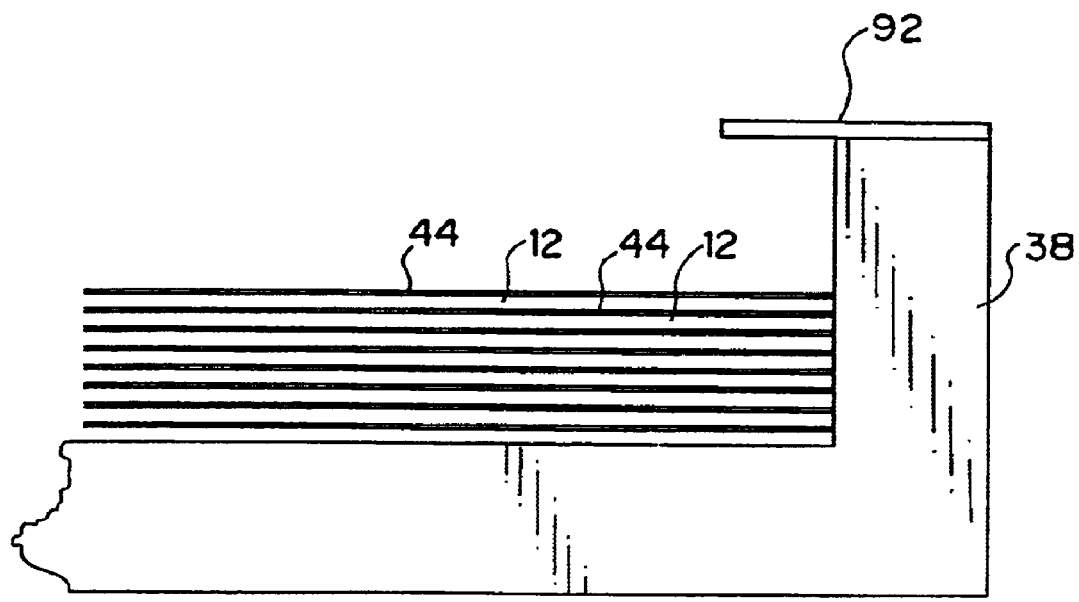
FIG. 3 is an enlarged view of a laminated structure of interleaf sheets and printing plates accommodated in a cassette.

As shown in FIG. 3, in the cassette 38, the printing plates 12 are stacked alternately with thin-film-like interleaf sheets 44 for protecting the image forming layers of the printing plates 12. The printing plates are stacked with the image forming layers thereof facing downward (facing toward the surface on which the automatic printing plate exposure device 10 is set).

Each cassette 38 accommodates printing plates 12 of a single size, with the respective cassettes 38 accommodating printing plates 12 of respectively different sizes. A printing plate 12 of a designated size can be fed into the exposure section 14.

Figure 13B:
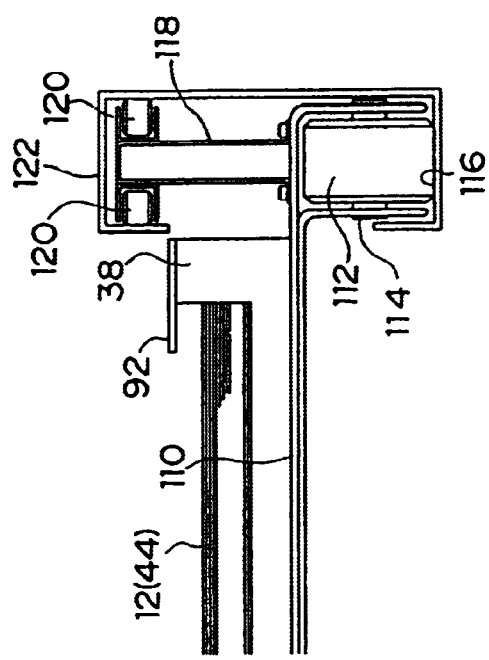
FIG. 13B is a right side view of FIG. 13A.
Figure 13A:
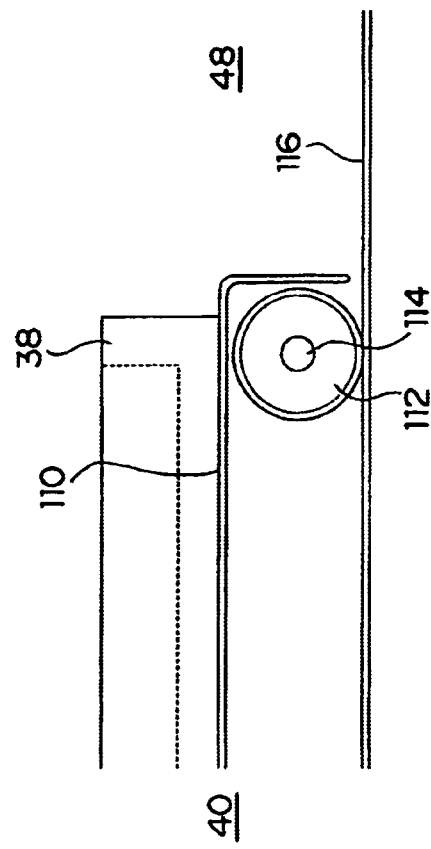
FIG. 13A is a front view showing a cassette withdrawing mechanism.

Here, the cassettes 38, other than the cassette at the lowest level, can be moved horizontally independently of one another. Namely, as shown in FIGS. 13A and 13B, the cassette 38 is supported on a sliding base 110. Supporting rollers 112 are mounted via shafts 114 to the widthwise direction end portions of the sliding base 110, i.e., the end portions of the sliding base 110 of the direction orthogonal to the sliding direction. The supporting rollers 112 are supported on rails 116. In this way, the sliding base 110 can be moved (slid) on the rails 116 with hardly any frictional resistance.

A pair of width guiding rollers 120 are mounted via a bracket 118 to the upper surface side of the sliding base 110 at the portion where the supporting roller 112 is mounted. The pair of width guiding rollers 120 are accommodated in a substantially C-shaped guide portion 122 provided erect from the rail 116, and guide the edges of the sliding base 110 at the time when the sliding base 110 moves. The rails 116 extend to a cassette withdrawing space section 48 provided adjacent to the cassette accommodating section 40. The cassettes 38 which are not needed are moved horizontally along the rails 116. Namely, for example, if the printing plates 12 of the selected size are accommodated in the lowest cassette 38, the top cassette 38 and the cassette 38 which is second from the top are moved horizontally into the cassette withdrawing space section 48 (refer to the imaginary lines in FIG. 1). Note that the cassette withdrawing space section 48 may be formed merely as a framework by steel members, or may be structured such that some of or all of the six surfaces thereof are covered by steel plate members.

The feature of the present embodiment is that the selected cassette 38 can be accessed as is at its predetermined position within the cassette accommodating section, without being moved in the horizontal direction.

An interleaf sheet accommodating box 49, which accommodates the interleaf sheets 44 which have been discharged from the interior of the device, is provided above the cassette withdrawing space section 48. The interleaf sheet accommodating box 49 receives the interleaf sheets 44 which have been discharged from a slit hole 51 provided in the wall of the device which wall is adjacent to the interleaf sheet accommodating box 49.

The conveying unit 42 has a pair of guide rails 50 along the conveying direction of the printing plate 12 (the left-right direction in FIG. 1). The interval between the pair of guide rails 50 is greater than or equal to the widthwise dimension of the printing plate 12, such that the printing plate 12 can pass between the pair of guide rails 50.

A (tooth form) rack 52 is formed on the top surface of each guide rail 50. A pinion (gear) 54 meshes with the rack 52. A rotating/moving body 58, which is coaxial with the pinion 54, is mounted to a rotating shaft 56 of the pinion 54. Hereinafter, explanation, centering on the rotating/moving body 58, will be given of the rotating/moving body 58 and the structures at the periphery thereof. Because the rotating/moving bodies 58 provided at the pair of racks 52 have the same structures, only one of the rotating/moving bodies 58 will be described, and description of the other will be omitted.

A reduction mechanism (not shown), which is set to a predetermined reduction ratio, is provided between the rotating/moving body 58 and the rotating shaft 56. The rotating/moving body 58 rotates substantially 180° during the period of time that the pinion 54 moves between the both end portions of the rack 52.

A guide rod 62 projects from the rotating/moving body 58 in the radial direction. The guide rod 62 is inserted into a bracket 64. In this way, the bracket 64 can move in the radial direction of the rotating/moving body 58. Further, a compression coil spring 66 is attached to the guide rod 62, and urges the bracket 64 in the direction of moving away from the rotating/moving body 58.

As shown in FIGS. 4A and 4B, one end portion of a belt 68 (or a wire) is anchored at the upper end of the left side surface of the bracket 64. From this anchored portion, the belt 68 reverses at the lower end portion of the bracket 64, is trained around the rotating/moving body 58, and thereafter, is disposed along the guide rail 50 to the exposure section 14 side.

A pulley 70 is disposed beneath a vicinity of the exposure section 14 side end portion of the guide rail 50. After the belt 68 is trained around the pulley 70, the belt 68 is taken up in a coiled form onto a reel 76 mounted to the rotating shaft of a motor 72.

In the state in which the rotating/moving body 58 is in a vicinity of the right end portion (in FIG. 1) of the guide rail 50, when the belt 68 is taken-up onto the reel 76 by the driving force of the motor 72, torque is applied to the rotating/moving body 58, and the pinion 54 rotates and moves along the rack 52 in accordance with the torque.

The rotation of the pinion 54 is transmitted to the rotating/moving body 58 such that the rotation of the rotating/moving body 58 may be sped-up. Therefore, the rotating/moving body 58 rotates counterclockwise in FIG. 1 while moving along the guide rail 50 due to a tensile force. Further, as the rotating/moving body 58 moves to the vicinity of the left end portion (in FIG. 1) of the guide rail 50 while rotating, the bracket 64 rotates 180° counterclockwise from the state of being positioned downward of the rotating/moving body 58, and moves to a position upward of the rotating/moving body 58.

Figure 5:
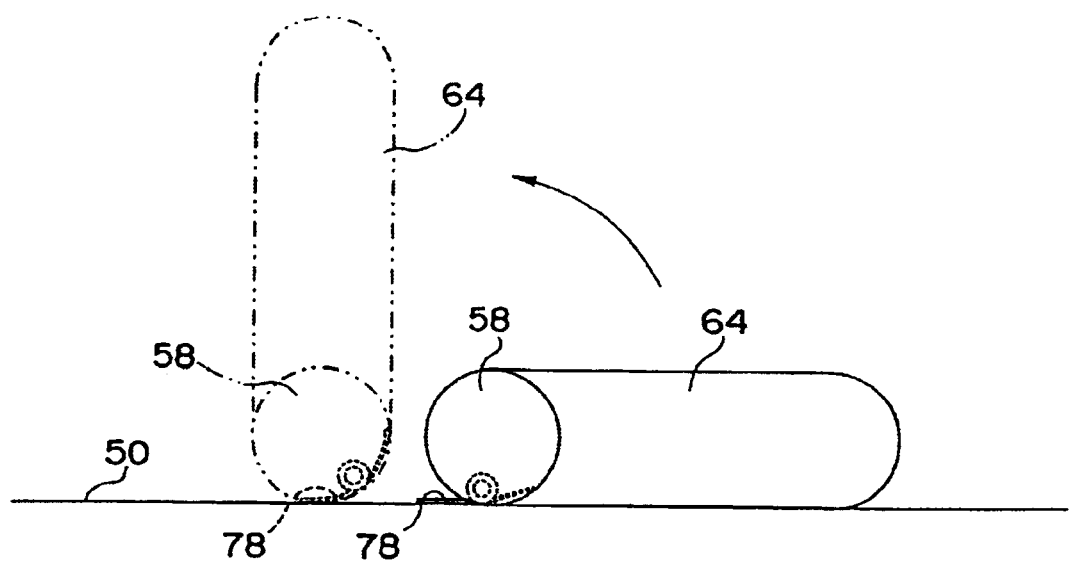
FIG. 5 is a front view showing a state in which the rotating/moving body and the bracket are moving.

As shown in FIG. 5, a torsion coil spring 78 is attached to the rotating/moving body 58. One end portion of the torsion coil spring 78 is fixed to the rotating/moving body 58 itself, whereas the other end portion of the torsion coil spring 78 projects in a tangential direction of the rotating/moving body 58. After the bracket 64 has rotated substantially 90° from the state in which the bracket 64 is directed downward, this other end portion of the torsion coil spring 78 contacts the guide rail 50. Thereafter, the torsion coil spring 78 urges the rotating/moving body 58 to rotate clockwise in FIG. 5. This is the direction against the winding-up of the belt 68 by the driving force of the motor 72.

In this way, when the belt 68 is wound out from the reel 76 due to the driving force of the motor 72, the bracket 64 and the rotating/moving body 58 rotate clockwise in FIG. 1 due to the urging force of the torsion coil spring 78.

When the winding-out of the belt 68 from the reel 76 is interrupted, the rotation of the rotating/moving body 58 is interrupted due to the weight of the bracket 64. Thus, the pinion 54 accelerates and rotates along the rack 52. Therefore, the rotating/moving body 58 and the bracket 64 move to a vicinity of the right end portion (in FIG. 1) of the guide rail 50 while rotating 180°.

When the winding-out of the belt 68 from the reel 76 is again interrupted, the tension of the belt 68, which was being made to contact the rotating/moving body 58 and the bracket 64 against the urging force of the compression coil spring 66, is relaxed, and the bracket 64 moves downward along the guide rod 62. Namely, the bracket 64 can be made to correspond to the heights of the respective cassettes 38, in accordance with the amount of loosening of the belt 68 (see FIG. 4B).

As shown in FIG. 2, a suction cup unit 80 spans between the brackets 64 provided at the pair of rotating/moving bodies 58.

The suction unit 80 is formed from a substantially U-shaped suction cup bracket 81 whose upper side is open; a plurality of suction cups 82 provided in a row along the widthwise direction of the printing plate 12 at the bottom surface of the suction cup bracket 81 (in the present embodiment, there are nine suction cups 82); and a plurality of air suction pipes 84 for sucking-in air from the suction cups 82 so as to provide the suction cups 82 with a sucking force (in the present embodiment, there are three systems of air suction pipes 84).

One end portion of each air suction pipe 84 is branched off so as to correspond to three suction cups 82. A magnet pump 86 is mounted to the other end portion of the air suction pipe 84.

Further, a solenoid valve 88 and a negative pressure sensor 90 are disposed along the air suction pipe 84.

The suction cups 82 face the printing plates 12 which are accommodated in the cassettes 38. When the belts 68 are wound-out from the reels 76 of the motors 72 and the brackets 64 move away from the rotating/moving bodies 58, the suction cups 82 abut the top surface (reverse surface) of the uppermost printing plate 12 in the selected cassette 38, in a vicinity of the right end portion in FIG. 1.

The positions (axes) of the suction cups 82 are always constant. Because the cassettes 38 which are not selected are made to withdraw into the cassette withdrawing space section 48, the cassette 38 which has been selected and is needed can always be made to oppose the suction cups 82.

In this state, the magnet pumps 86 are operated such that the suction cups 82 are provided with sucking force, and fit tightly to the printing plate 12. This tightly-fitting state can be detected by a signal from the negative pressure sensor 90. When the tightly-fitting state is detected, the solenoid valves 88 are set in a closed state such that the force by which the suction cups 82 and the printing plate 12 are fit tightly together can be maintained.

When the brackets 64 are raised in the state in which the suction cups 82 are fit tightly to the printing plate 12, the uppermost printing plate 12 can be lifted up and removed.

Figure 6A:
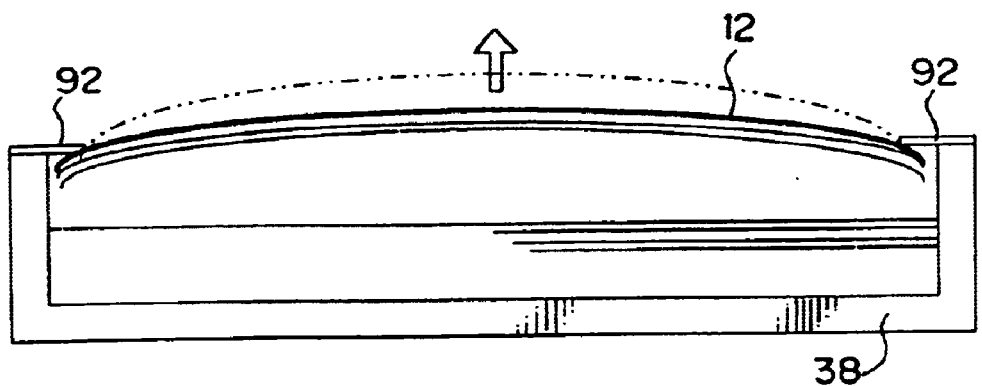
FIGS. 6A and 6B are right side views of a cassette, showing processes of printing plate removal by separating plates.
Figure 6B:
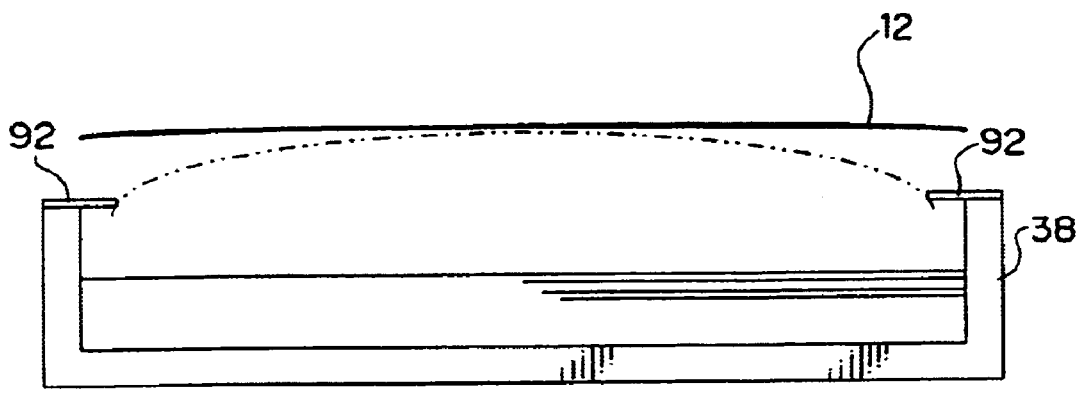

Separating plates 92 are mounted to the two corner portions at the right end portion (in FIG. 1) of the cassette 38. The separating plates 92 are provided at positions which interfere with the locus of movement of the printing plate 12 at the time of removing the printing plate 12. Namely, when the printing plate 12 is raised up, the movement of the both corner portions of the printing plate 12 is obstructed such that the printing plate 12 curves over the range of its transverse direction (see FIG. 6A). Due to this curving, the ability of the printing plate 12 to separate from the interleaf sheet 44 or the printing plate 12 therebeneath improves. When the uppermost printing plate 12 rides over the separating plates 92, it is possible for only this uppermost printing plate 12 to be separated (see FIG. 6B).

As shown in FIG. 1, a circular arc shaped guide plate 94 is mounted to the bracket 64. The guide plate 94 is in the form of ¼ of a circle (or ¼ of an oval or is parabolic). When the suction cups 82 are suctioning the printing plate 12, as the bracket 64 rotates 180° around the rotating/moving body 58, the guide plate 94 functions as a guide surface which turns the printing plate 12 over while the printing plate 12 is trained thereon (refer to the chain lines in FIG. 1).

As shown in FIGS. 7A, 7B, 8A and 8B, an interleaf sheet removing mechanism section 46 is provided at the right side inner side surface of the conveying unit 42 at the plate removing/conveying section 15.

The interleaf sheet removing mechanism section 46 is formed by a supporting portion 150 and an operation portion 152. The supporting portion 150 is formed by a ceiling plate 154 connected, so as to be movable up and down, to the inner side surface of the conveying unit 42; and a pair of guide plates 156 which are parallel to one another, whose one ends are joined to the bottom surface of the ceiling plate 154, and whose other ends hang downwardly.

A rising/falling plate 158, which forms a portion of the operation portion 152, is disposed between the pair of guide plates 156. The rising/falling plate 158 is formed by bending a thin plate member into a substantial L-shaped form. The main surface (vertical wall surface) of the rising/falling plate 158 is oriented substantially 90° (substantially 90° as seen in plan view) with respect to the pair of guide plates 156.

A plurality of roller pairs 160 are mounted to the surfaces of the pair of guide plates 156 which surfaces face one another. The both widthwise direction end portions of the rising/falling plate 158 are nipped between the respective roller pairs 160. In this way, the rising/falling plate 158 is guided by the roller pairs 160, and is held so as to be freely movable upward and downward with respect to the guide plates 156. Namely, in the free state, the rising/falling plate 158 moves downward due to its own weight.

Here, a horizontal surface portion 158A of the curved top portion of the rising/falling plate 158 serves as a stopper. The amount of downward movement of the rising/falling plate 158 is limited by the horizontal surface portion 158A abutting the uppermost roller pairs 160.

A pair of nipping members 162, 164, which are bent in substantial U-shapes and which, together with the rising/falling plate 158, form the operation portion 152, are mounted to the rising/falling plate 158. The one nipping member 162 is fit tightly to and fixed to a main surface (vertical wall surface) 158B of the rising/falling plate 158. The other nipping member 164 is rotatably connected to the upper end portion of the one nipping member 162 via a shaft 166. The other nipping member 164 is bent in an open (wide) substantial V-shape at the longitudinal direction intermediate portion thereof.

A torsion coil spring 168 is attached to the shaft 166. Due to the urging force of the torsion coil spring 168, the pair of nipping members 162, 164 rotate relatively in directions of moving away from one another (directions of widening), and are held (in the state shown in FIGS. 7A and 7B) at a predetermined wide angle at which there is a balance between the urging force and the rotating force due to their own weight, or a predetermined wide angle which is limited by an unillustrated stopper.

Grasping members 170 are mounted to the bottom end portions of the nipping members 162, 164. The grasping members 170 are rectangular block shaped members formed from a material which is relatively soft (has low hardness) such as synthetic resin, rubber, or the like. The grasping members 170 are members requiring a predetermined frictional force at at least the bottom end surfaces thereof.

The grasping members 170 function to grasp the interleaf sheet 44 laying on the surface of the printing plate 12.

A pushing member 172 is mounted to the bottom surface of the ceiling plate 154 so as to correspond to the other nipping member 164. The pushing member 172 hangs down so as to be directed toward the rear side of the other nipping member 164. A roller 174 is mounted to the lowermost end portion of the pushing member 172. The roller 174 abuts the other nipping member 164 when the ceiling plate 154 and the pair of nipping members 162, 164 move relative to one another (move in directions of approaching one another).

Figure 7A:
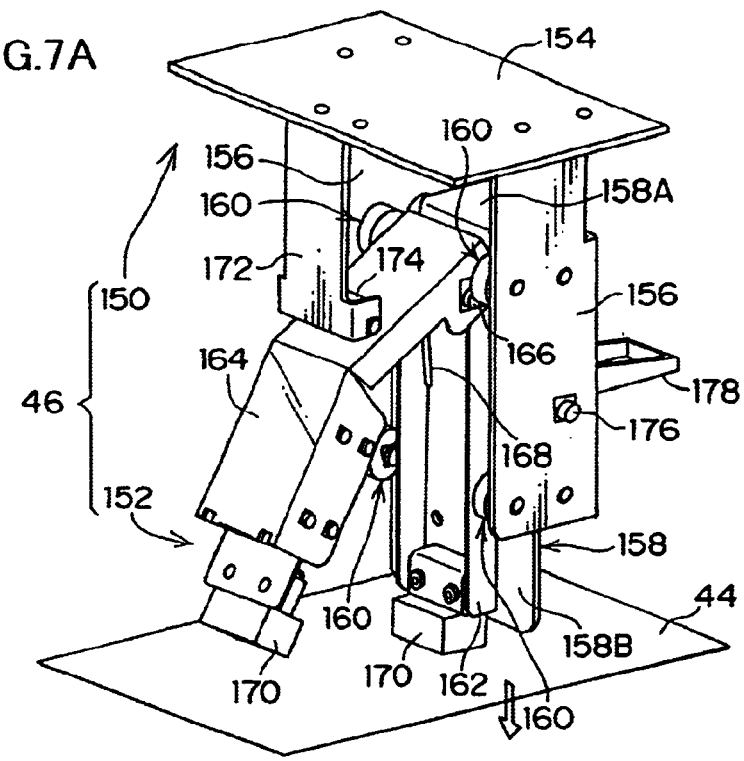
FIG. 7A is a perspective view showing a standby state of an interleaf sheet removing mechanism section.
Figure 7B:
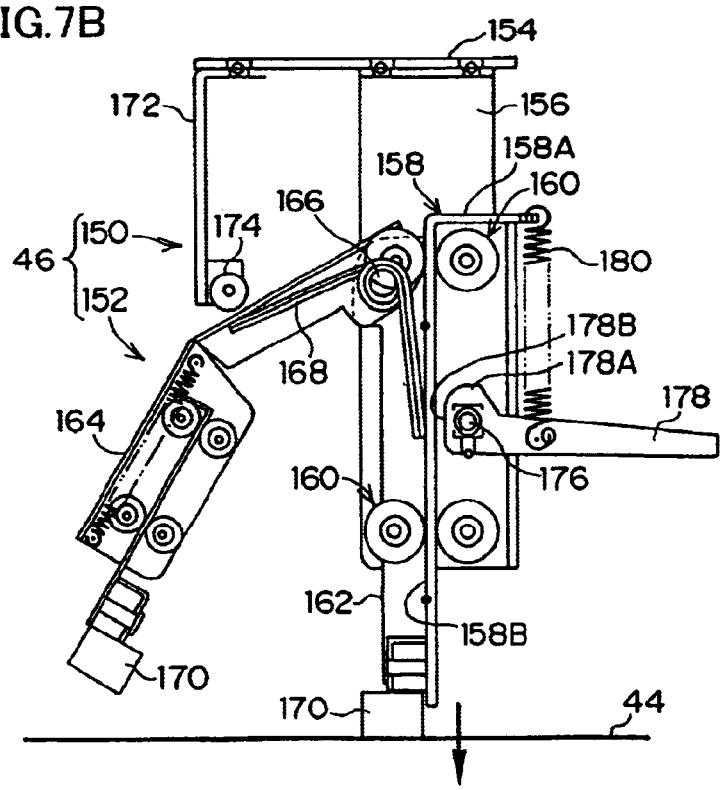
FIG. 7B is a front view thereof.
Figure 8A:
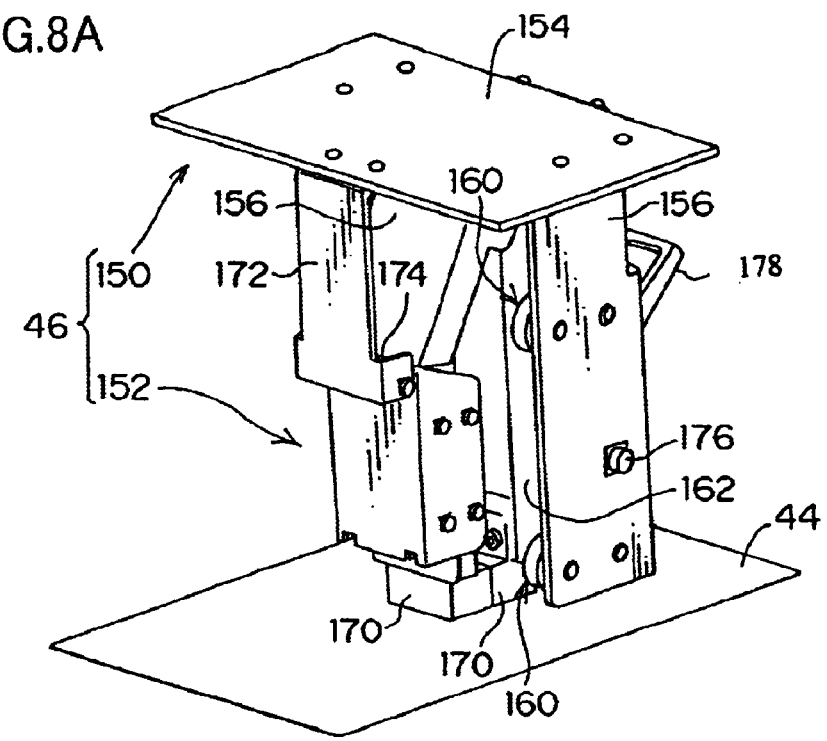
FIG. 8A is a perspective view showing an interleaf sheet holding state of the interleaf sheet removing mechanism section.
Figure 8B:
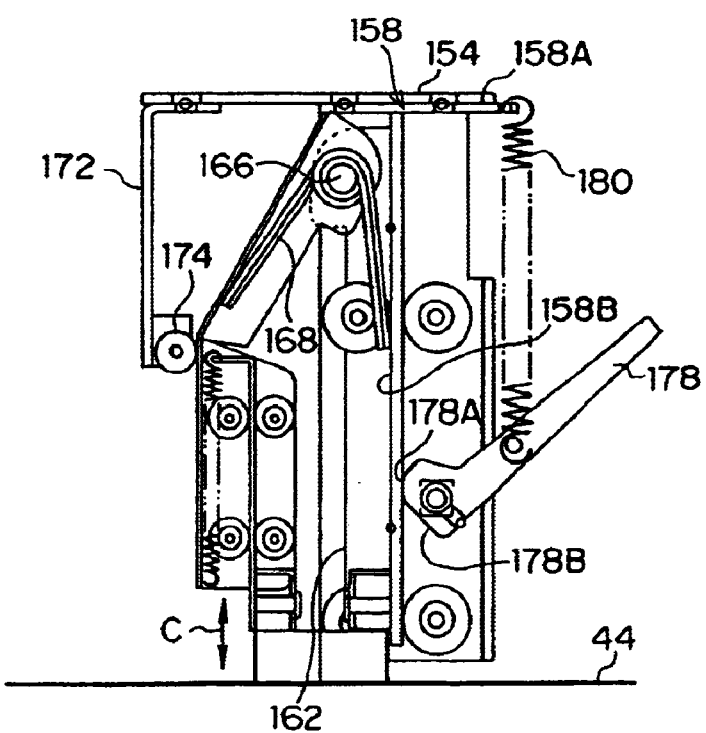
FIG. 8B is a front view thereof.

When relative movement in the same direction (the direction of approaching one another) continues from the aforementioned abutting state, the frictional force is lessened by the roller 174. Thus, movement is interrupted smoothly, and the pushing force of the pushing member 172 becomes a force counteracting the urging force of the torsion coil spring 168, and the other nipping member 164 rotates around the shaft 166 toward the one nipping member 162. (FIGS. 7A and 7B illustrate the state immediately before the start of relative movement.) This relative movement starts when the ceiling plate 154 falls with respect to the rising/falling plate 158 which is in a free state with respect to the ceiling plate 154 (i.e., which is at the lowermost position), or in other words, starts when the grasping members 170 abut the surface of the interleaf sheet 44 and falling of the rising/falling plate 158 is impeded.

In this state, when the ceiling plate 154 falls further, the pushing member 172 applies pushing force to the other nipping member 164. While the other nipping member 164 is in the midst of rotating around the shaft 166 in the direction of approaching the one nipping member 162, the interleaf sheet 44 follows due to the frictional force. At this time, the one nipping member 162 abuts the interleaf sheet 44 and impedes movement of the interleaf sheet 44. Thus, an amount of slack, which corresponds to the amount by which the interleaf sheet 44 follows, arises at the interleaf sheet 44. Note that a slight amount of extension and contraction due to urging force is possible at the grasping member 170 which is mounted to the other nipping member 164 (see arrow C in FIG. 8B). Due to this slack portion being nipped by the pair of grasping members 170, the interleaf sheet 44 can be held (the state shown in FIGS. 8A and 8B).

A shaft 176 spans between the pair of guide plates 156, at the space at the side opposite the surface of the rising/falling plate 158 to which surface the one nipping member 162 is mounted. A lock lever 178 is rotatably mounted to the shaft 176. One end portion of a helical tension spring 180 (see FIGS. 7B and 8B), whose other end portion is fixed to the horizontal surface portion 158A of the rising/falling plate 158, is attached to the lock lever 178. The lock lever 178 is usually held in a substantially horizontal state as seen from the front surface of FIG. 7B. The left end (in FIG. 7B) of the lock lever 178 is formed so as to be thick, and a circular arc surface portion 178A and a flat surface portion 178B are formed at the outer peripheral surface thereof. In the state shown in the figures, the flat surface portion 178B opposes the rising/falling plate 158.

Here, when the rising/falling plate 158 moves relative to the ceiling plate 154, the lock lever 178 slightly rotates counterclockwise in FIG. 7B due to the urging force of the helical tension spring 180, and the circular arc surface portion 178A contacts the rising/falling plate 158. Thereafter, the lock lever 178 rotates counterclockwise in FIG. 7B around the shaft 176 due to the frictional force with the rising/falling plate 158. When the lock lever 178 reaches the state shown in FIG. 8B in which it is inclined upward to the right, the circular arc surface portion 178A contacts the rising/falling plate 158.

The state in which the circular arc surface portion 178A contacts the rising/falling plate 158 is a so-called lock state, and the current relative positional relationship between the ceiling plate 154 and the rising/falling plate 158 (the state of the pair of grasping members 170 contacting one another) can be maintained.

When, in this state, the ceiling plate 154 is raised, the ceiling plate 154 is raised with the pair of grasping members 170 holding the interleaf sheet 44. Thus, the interleaf sheet 44 can be raised upward while being grasped.

This movement is carried out only when the uppermost material in the cassette 38 is the interleaf sheet 44, and lowering of the ceiling plate 154 is not carried out in a case in which the uppermost material is the printing plate 12.

A lock releasing pin 182 (see FIG. 1) is disposed on the locus of movement of the lock lever 178 at the time when the ceiling plate 154 is being raised. When the ceiling plate 154 is raised by a predetermined amount, the lock lever 178 abuts the lock releasing pin 182, and movement of the lock lever 178 is impeded. Thus, the lock lever 178 rotates clockwise in FIG. 8B around the shaft 176. In this way, the flat surface portion 178B again opposes the rising/falling plate 158, and the state of contact is cancelled. Thus, the urging force of the helical tension spring 180 is restored, and the lock lever 178 can be maintained in a substantially horizontal state.

Figure 9:
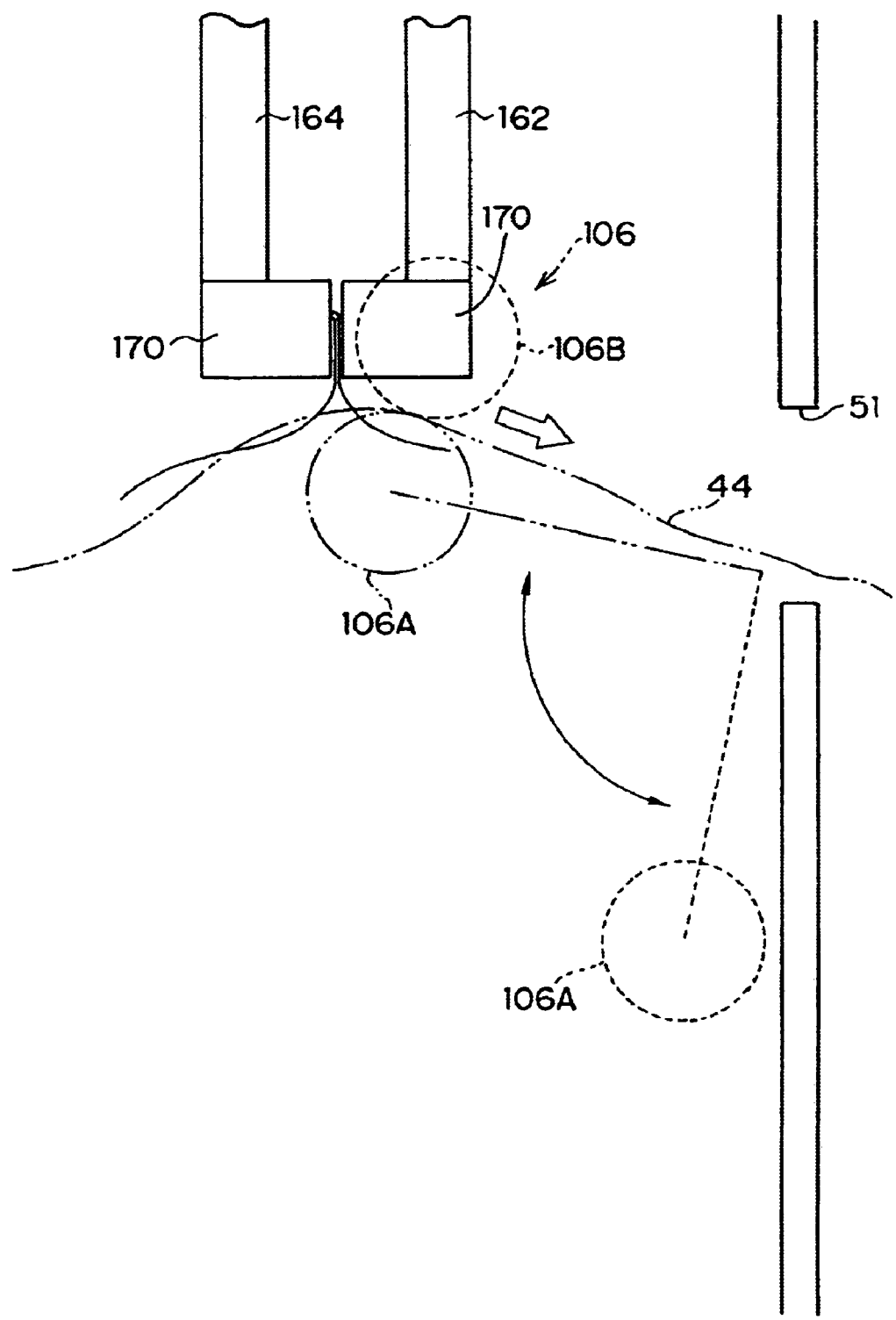
FIG. 9 is a front view showing a state in which an interleaf sheet is being discharged by driving of a roller pair.

As shown in FIG. 9, before the ceiling plate 154 is raised by a predetermined amount, the end portion of the interleaf sheet 44 is nipped by a roller pair 106, and control is carried out such that raising is temporarily stopped at that position.

Namely, as shown in FIG. 9, the roller pair 106 which is nipping the interleaf sheet 44 which is being grasped and raised, is provided in a region in a vicinity of the locus of upward movement of the rising/falling plate 158. Among the rollers of the roller pair 106, a lower roller 106A can approach and move away from the upper roller 106B, and is usually in a state of being separated from the upper roller 106B. At the point in time when the interleaf sheet 44, which is being grasped and raised, contacts the upper roller 106B, the lower roller 106A approaches the upper roller 106B. In this way, the interleaf sheet 44 can be nipped by the roller pair 106.

The roller pair 106 is rotated by the driving force of a driving means, and the interleaf sheet 44 is discharged out through the slit hole 51 into the interleaf sheet accommodating box 49 (see FIG. 1) provided at the top surface of the cassette withdrawing space section 48.

Figure 10A:
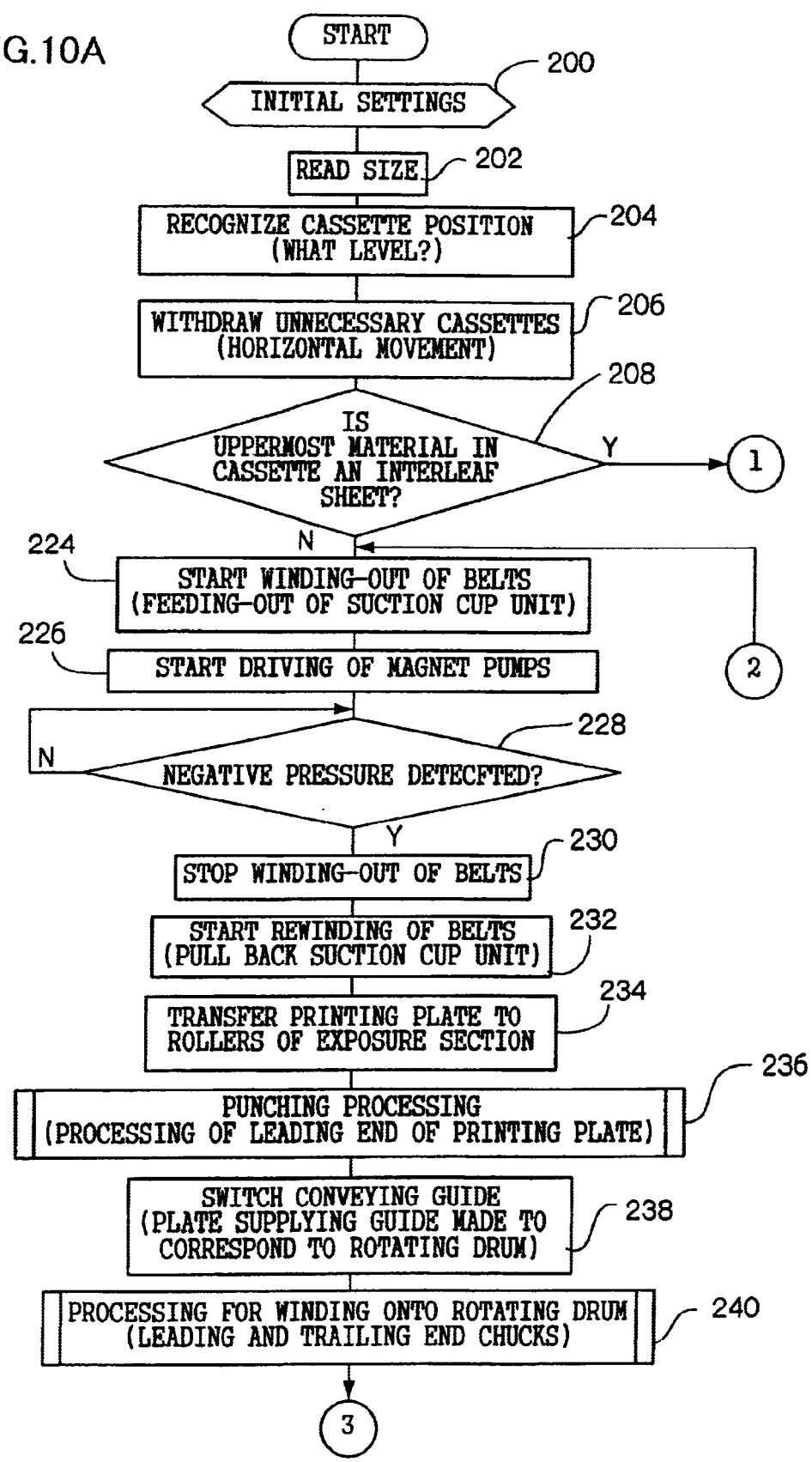
FIGS. 10A, 10B and 10C are flowcharts showing a flow of processings of the automatic printing plate exposure device relating to the present embodiment.
Figure 10B:
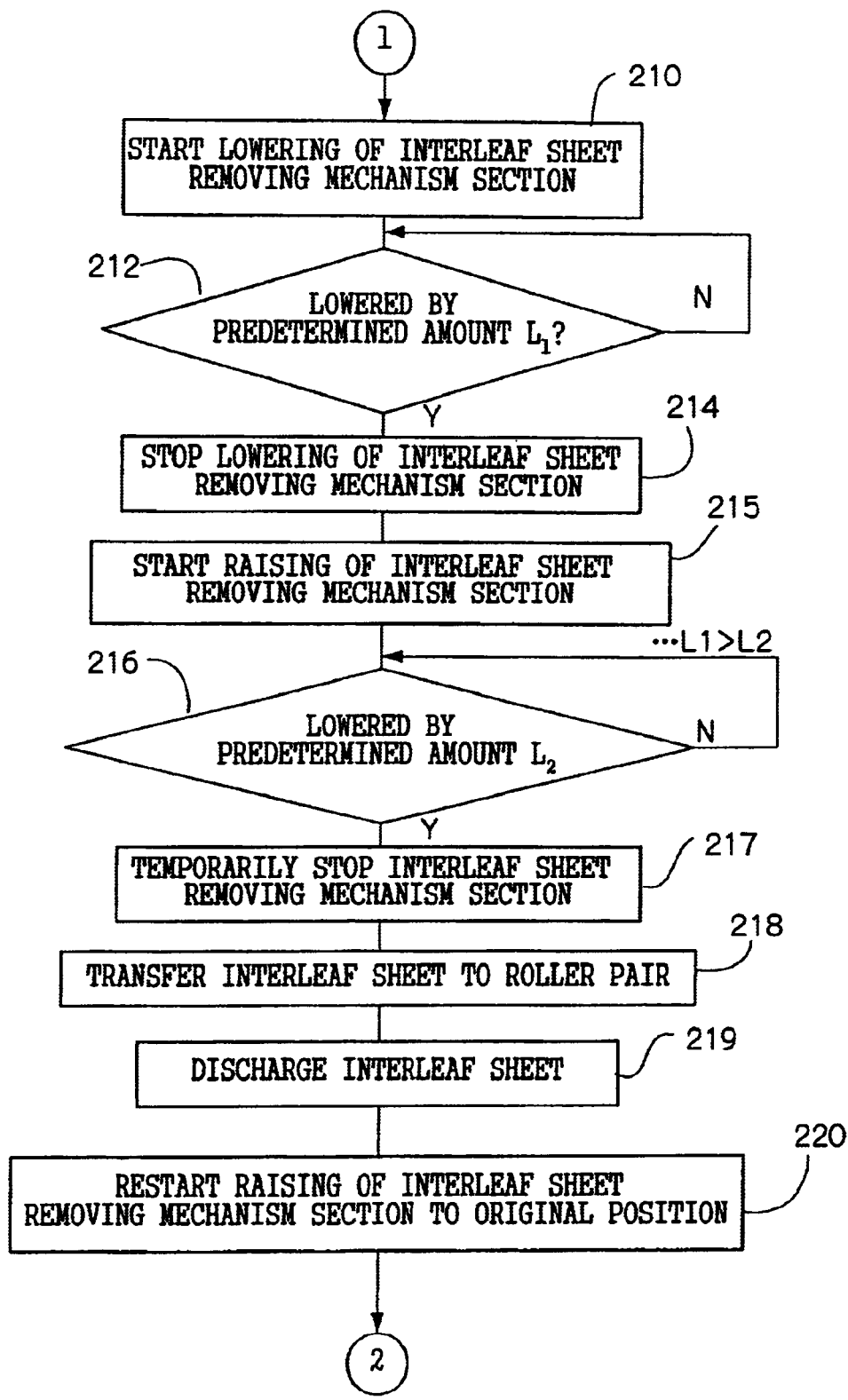
Figure 10C:
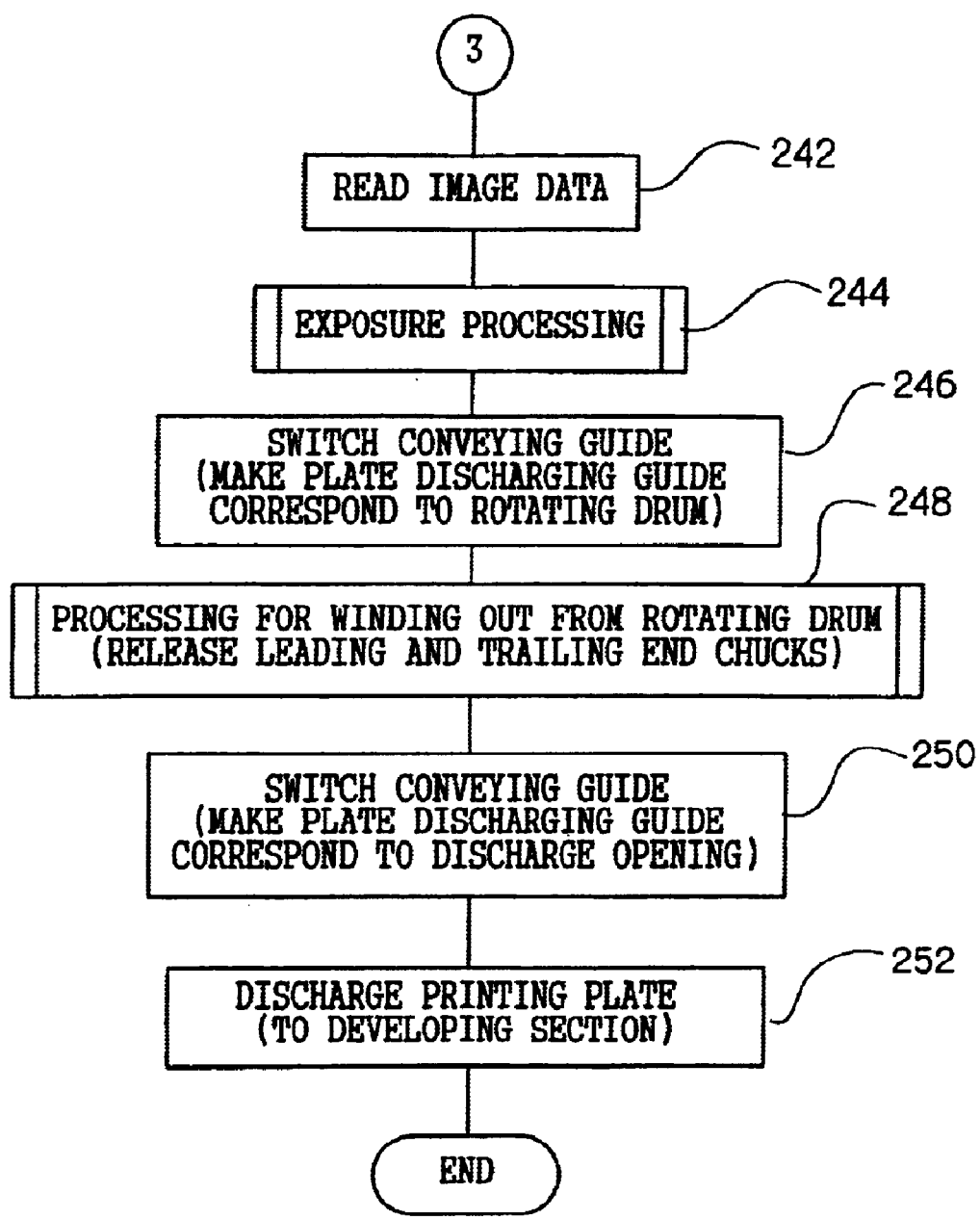

Hereinafter, operation of the present embodiment will be described in accordance with the flowcharts of FIGS. 10A, 10B and 10C.

First, in step 200, initial settings of the respective sections are carried out. Namely, the suction cup unit 80 is set at the left end portion (in FIG. 1) of the guide rails 50 (the exposure section 14 side of the guide rails 50), and the plate supplying guide 20 of the conveying guide unit 18 of the exposure section 14 is made to correspond to the puncher 24.

In subsequent step 202, the size of the printing plate 12 which is to be processed from here on is read. In following step 204, it is recognized in which of the cassettes 38 the printing plates 12 of the read size are accommodated.

Figure 12:
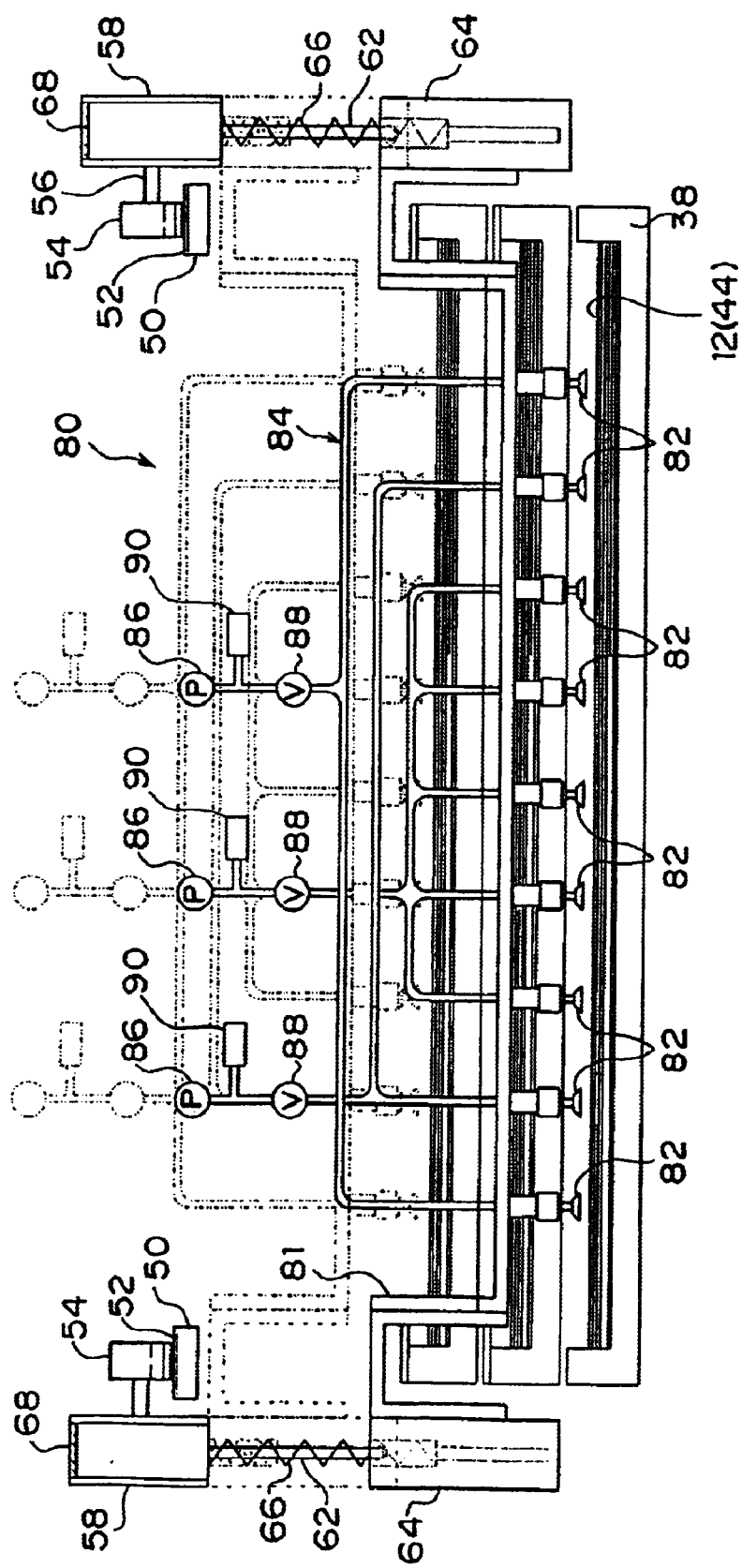
FIG. 12 is a right side view of FIG. 11.

In step 206, the cassettes 38 other than the recognized cassette 38, i.e., the unnecessary cassettes, are withdrawn by being moved horizontally. For example, if the cassette 38 which is needed is the uppermost cassette, there is no need to withdraw any cassettes 38. Further, if the cassette 38 which is needed is the third from the top, the uppermost and second cassettes 38 are moved horizontally to the cassette withdrawing space section 48, and are withdrawn. In this way, it is possible to access the necessary cassette 38 (see FIGS. 11 and 12).

In subsequent step 208, in the state in which it is possible to access the necessary cassette 38, a judgement is made as to whether the topmost material is the interleaf sheet 44 or the printing plate 12. This can be detected by non-contact detection by using a reflection type sensor (not shown) or the like and utilizing the difference in reflectances, or can be detected by the difference in electrical conductivities detected by a contact type sensor.

When the determination in step 208 is affirmative, the uppermost material is an interleaf sheet. Therefore, the routine proceeds to step 210 where operation for removing the interleaf sheet 44 is started. Namely, as the control of operation, in step 210, lowering of the interleaf sheet removing mechanism section 46 is started. At the point in time when it is determined in step 212 that the interleaf sheet removing mechanism section 46 has been lowered a predetermined amount ($L_1$), the lowering thereof is stopped (step 214). The operations up until now are operations for holding the interleaf sheet. During these operations, the following operations are carried out at the interleaf sheet removing mechanism section 46:

① the grasping member 170 at the distal end of the rising/falling plate 158 abuts the interleaf sheet 44;
② the supporting portion 150 moves relative to the operation portion 152;
③ the lock lever 178 rotates;
④ the other nipping member 164 rotates around the shaft 166 (approaches the one nipping member 162) due to the pushing plate 172;
⑤ the interleaf sheet 44 is made slack and is nipped by the grasping members 170; and
⑥ the nipped state is maintained by the lock lever 178.

Thereafter, in step 215, raising of the interleaf sheet removing mechanism section 46 is started. At the point in time when it is judged in step 216 that the interleaf sheet removing mechanism section 46 has been raised by a predetermined amount (an amount $L_2$ which is slightly smaller than the moving amount $L_1$ at the time of the above-described lowering), raising is temporarily stopped (step 217). In this state, in step 218, transfer of the interleaf sheet 44 to the roller pair 106 is carried out.

Namely, the interleaf sheet 44 nipped by the grasping members 170 is positioned at the lower side of the upper roller 106B (whose position is fixed) of the roller pair 106, and the lower roller 106A (which is movable) is made to approach the upper roller 106B due to the rotating movement of an arm. In this way, the interleaf sheet 44 is nipped by the roller pair 106.

Next, when driving of the roller pair 106 starts, the interleaf sheet 44 is conveyed to the exterior of the device, and is discharged into the interleaf sheet accommodating box 49 (step 219).

Further, in step 220, substantially simultaneously with the starting of driving of the roller pair 106 (the discharging of the interleaf sheet 44) by above step 219, raising of the interleaf sheet removing mechanism section 46 is restarted. The interleaf sheet removing mechanism section 46 is returned to its original position, and the routine moves on to step 224.

When raising of the interleaf sheet removing mechanism section 46 is restarted, the lock lever 178 abuts the releasing pin 182. In this way, the lock lever 178 rotates around the shaft 176, and the surface thereof opposing the rising/falling plate 158 changes from the circular arc surface portion 178A to the flat surface portion 178B, and the holding of the rising/falling plate 158 is released. In this way, the rising/falling plate 158 moves to its lowermost position due to its own weight. This is relative movement between the supporting portion 150 and the operation portion 152, and pressing of the rising/falling plate 158 by the pressing plate 172 also is released. Thus, the pair of nipping members 162, 164 open to a predetermined angle due to the urging force of the torsion coil spring 168, and nipping of the interleaf sheet 44 is released.

The processing of step 224 is carried out in a case in which the determination in step 208 is negative, i.e., when it is determined that the uppermost material in the cassette 38 is the printing plate 12. Steps from step 224 on are operations of removing the printing plate 12.

In step 224, winding-out of the belts 68 is started. Note that, immediately after the interleaf sheet 44 has been removed, the brackets 64 are positioned at the right ends of the guide rails 50. Thus, from the time immediately after the start of winding-out of the belts 68, the brackets 64 separate (fall) downwardly away from the rotating/moving bodies 58.

In next step 226, the magnet pumps 86 are driven, and in following step 228, a determination is made as to whether a predetermined negative pressure has been detected by the negative pressure sensors 90. Namely, as the brackets 64 are lowered, the suction cups 82 approach the printing plate 12, and the suction surfaces of the suction cups 82 contact the top surface (the non image forming surface) of the printing plate 12. The interiors of the pipes of the suction cups 82 thereby become negative pressure, and the suction cups 82 can suction the printing plate 12.

When it is judged in step 228 that negative pressure has been detected, the routine moves on to step 230 where winding-out of the belts 68 is stopped. This is the state in which the suction cups 82 are fit tightly to the printing plate 12. In subsequent step 232, the belts are rewound.

Due to the belts 68 being rewound, the brackets 64 are raised so as to approach the rotating/moving bodies 58. Thus, the uppermost printing plate 12 is pulled up.

Here, the separating plates 92 are mounted to the both right and corner portions (in FIG. 1) of the cassette 38, and exist at positions interfering with the locus of the rising movement of the printing plate 12. Thus, the widthwise direction (left-right direction in FIG. 2) central portion of the printing plate 12 which has been pulled up by the suction cups 82 curves convexly. Due to this bending, a layer of air is formed between the printing plate 12 and the material therebeneath, and the ability to separate the printing plate 12 from the material therebeneath improves.

Accordingly, after the printing plate 12 rides over the separating plates 92, only this uppermost printing plate 12 is carried upward by the suction cups 82.

Because the printing plate 12 which has been pulled up is in a state of being held at one side thereof, it is gradually turned over from the right end portion side (in FIG. 1) thereof. When the rewinding of the belts 68 is interrupted, the brackets 64 begin to rotate counterclockwise in FIG. 1. Further, together with this rotation, the pinions 54 rotate while meshing with the racks 52. Thus, the rotating/moving bodies 58 and the brackets 64 move horizontally toward the left end portions of the guide rails 50.

During this horizontal movement, the suction cups 82 change from a state of being directed downward to a state of being directed upward, and the front and reverse surfaces of the printing plate 12 are inverted. At the time of this inversion, the printing plate 12 is supported by the circular arc shaped guide plates 94. Thus, not all of the load is applied to the suction cups 82, and there is no need to make the suction force of the suction cups 82 greater than needed.

At the stage when the leading end of the printing plate 12 enters in between the conveying rollers 108, about half of the printing plate 12 at the leading end side thereof is supported so as to be fit tightly to the outer surfaces of the guide plates 94 and is curved in a circular arc shape as seen in side view. The remaining portion (the trailing end side) of the printing plate 12 is not supported, and is therefore in a free state in which it hangs downward.

In this state, the leading end of the printing plate 12 (which is the left side end portion in FIG. 1 because the printing plate 12 has been inverted) is nipped by the conveying rollers 108, and is transferred to the guide plate 109 of the exposure section 14 (step 234). In the conveying guide unit 18 of the exposure section 14, the printing plate 12 is fed to the plate supplying guide 20.

In subsequent step 236, because the plate supplying guide 20 corresponds to the puncher 24, the leading end of the printing plate 12 enters into the puncher 24 and is subjected to punching processing. Thereafter, the printing plate 12 is returned to the plate supplying guide 20.

Next, in step 238, the conveying guide unit 18 is switched such that the plate supplying guide 20 is made to correspond to the rotating drum 16. In this way, the printing plate 12 can be fed toward the rotating drum 16 from a direction tangent to the rotating drum 16.

The printing plate 12 which has been fed toward the rotating drum 16 is taken up tightly onto the peripheral surface of the rotating drum 16 by the leading end chuck 26 and the trailing end chuck 36 (step 240), and positioning for exposure is completed.

In subsequent step 242, image data is read, and exposure processing by the light beam from the recording head section 37 is started (step 244). The exposure processing is so-called scan-exposure in which the recording head section 37 is moved in the axial direction of the rotating drum 16 while the rotating drum 16 is rotated at high speed (main scanning).

When the exposure processing of step 244 has been completed, the routine moves onto step 246 where the conveying guide unit 18 is switched (such that the plate discharging guide 22 is made to correspond to the rotating drum 16). In the next step 248, the printing plate 12 which is wound on the rotating drum 16 is discharged from a tangential direction. At this time, the printing plate 12 is fed to the plate discharging guide 22.

When the printing plate 12 is fed to the plate discharging guide 22, the routine moves on to the next step 250 where the conveying guide unit 18 is switched such that the plate discharging guide 22 is made to correspond to the discharge opening. Next, in step 252, the printing plate 12 is discharged. The developing section is provided in this direction of discharging, and the printing plate 12 is then subjected to developing processing.

In accordance with the above-described embodiment, the cassettes 38, other than the lowermost cassette, are supported at the sliding bases 110 independently of one another, and the sliding bases 110 are moved (slid) on the rails 116 with hardly any frictional resistance. Moreover, the rails 116 extend to the cassette withdrawing space section 48 provided adjacent at the right side in FIG. 1, and the cassettes 38 which are not needed are moved horizontally along the rails 116. Thus, the printing plate 12 can be removed at a reference position without moving the necessary cassette 38 at all. In this way, there is no need to provide space for printing plate removal at each of the respective cassettes, and there is no need to move the printing plate removal position to the positions at which the respective cassettes are disposed.

Moreover, in the interleaf sheet removing mechanism of the present embodiment, when the uppermost material is an interleaf sheet, the interleaf sheet removing mechanism section 46 begins to be lowered. Due to this lowering, the interleaf sheet 44 is made slack and nipped by the grasping members 170 due to the mechanical interlocking of operations. The nipped state is maintained continuously by the lock lever 178. Thereafter, raising of the interleaf sheet removing mechanism section 46 is begun, and the interleaf sheet 44 is transferred to the roller pair 106. Therefore, there is no need for monitoring of the nipped state of the interleaf sheet 44 or the like by a sensor or the like. The number of parts can be reduced, and the control system can be simplified.

As described above, in the present invention, the complexity of work involved in so-called batch processing is overcome, and operation of, for example, removing a printing plate from a cassette in a small space is realized. Therefore, the present invention achieves the excellent effects that the operation efficiency can be improved and less space is required.

What is claimed is:

1. A device for selecting and conveying printing plates, comprising:
    a plurality of cassettes each able to accommodate a plurality of printing plates in a state in which the printing plates are stacked substantially horizontally, the plurality of cassettes being respectively movable, independently from others of the plurality of cassettes, between removal positions and withdrawn positions which are set apart from the removal positions substantially in a horizontal direction; and a conveying unit able to access each cassette of the plurality of cassettes in order to remove a printing plate from a cassette positioned at the removal position, such that when a cassette has a printing plate removed therefrom, there is not another cassette positioned immediately above the cassette having the printing plate removed therefrom, wherein all of the cassettes are aligned in a row vertically beneath the conveying unit when the cassettes are positioned at the removal positions.

2. The device of claim 1, wherein at a time of accessing an arbitrary one cassette, respective cassettes existing between the arbitrary one cassette and the conveying unit are moved from the removal positions to the withdrawn positions.

3. The device of claim 1, further comprising a cassette accommodating section which can accommodate all of the cassettes positioned at the removal positions.

4. The device of claim 1, further comprising a cassette withdrawal section which can accommodate all of the cassettes positioned at the withdrawn positions.

5. The device of claim 1, wherein all of the cassettes can move in the same direction toward the withdrawn positions.

6. The device of claim 1, wherein the conveying unit can remove the printing plate which is uppermost in the cassette positioned at the removal position.

7. The device of claim 1, wherein the conveying unit includes a conveying roller pair which can nip an end of a removed printing plate and feed-out the removed printing plate.

8. The device of claim 1, wherein the conveying unit can substantially invert a printing plate by suctioning one end of the printing plate and raising the one end of the printing plate so as to approach another end of the printing plate.

9. The device of claim 1, wherein the conveying unit has a suction cup unit for suctioning the printing plate, and the suction cup unit can move up and down in a vertical direction in order to access the cassettes.

10. The device of claim 1, further comprising an interleaf sheet removing mechanism which, at a time when the printing plate is removed, nips an interleaf sheet for protection, which is stuck to one surface of the printing plate, and can peel the interleaf sheet off from the printing plate.

11. The device of claim 1, wherein the particular cassette having the printing plate removed therefrom is maintained vertically below the conveying unit such that it does not need to be moved horizontally with respect to other cassettes for the conveying unit to access the printing plate which is to be removed.

* * * * *